United States Patent [19]

Kaneda

[11] 4,376,911
[45] Mar. 15, 1983

[54] CIRCUIT SYSTEM FOR LIGHTING A DISCHARGE LAMP OR LAMPS

[75] Inventor: Isao Kaneda, Otsu, Japan

[73] Assignee: New Nippon Electric Co., Ltd., Osaka, Japan

[21] Appl. No.: 217,901

[22] Filed: Dec. 18, 1980

[30] Foreign Application Priority Data

Dec. 28, 1979 [JP] Japan .................................. 54-173429
Apr. 18, 1980 [JP] Japan .................................. 55-52192
Aug. 28, 1980 [JP] Japan .................................. 55-119391

[51] Int. Cl.³ ............................................. H05B 41/14
[52] U.S. Cl. ..................................... 315/244; 315/101; 315/174; 315/176; 315/DIG. 2
[58] Field of Search ............... 315/101, 106, 171, 174, 315/176, 207, 244, 289, DIG. 2, DIG. 7

[56] References Cited
U.S. PATENT DOCUMENTS 3,758,818  9/1973  Kaneda ........................... 315/244 X
4,079,292  1/1976  Kaneda ........................... 315/289

*Primary Examiner*—Eugene R. La Roche
*Attorney, Agent, or Firm*—W. G. Fasse; D. F. Gould

[57] ABSTRACT

A discharge lamp lighting circuit system comprises a discharge lamp, an intermittent oscillation circuit, and an arrangement for controlling the energy supplied for lighting the discharge lamp with a high power factor. The intermittent oscillation circuit is energized by a low frequency a.c. power supply, i.e. a commercial alternating current power supply, for intermittently generating a high frequency high voltage in each half cycle of the alternating current of the low frequency a.c. power supply. By supplying the low frequency alternating current voltage and the intermittent high frequency high voltage to the lamp the discharge lamp is reignited in each half cycle of the a.c. of the low frequency alternating current power supply and the lit state of the discharge lamp is sustained by the low frequency alternating current voltage. The supplied energy controlling arrangement supplies the low frequency current to the discharge lamp during the operation period of the intermittent oscillation circuit and it also supplies the high frequency current generated by the intermittent oscillation circuit, effectively to the discharge lamp, whereby the discharge lamp is lit with a high power factor.

20 Claims, 25 Drawing Figures

FIG. 1
PRIOR ART
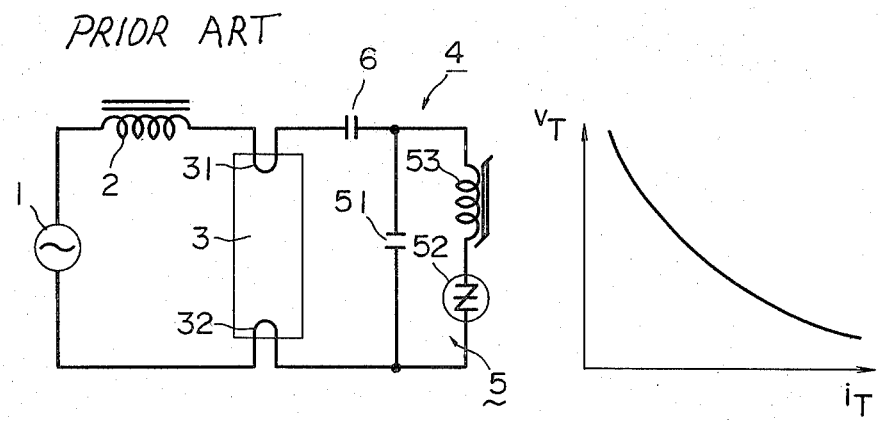
FIG. 3
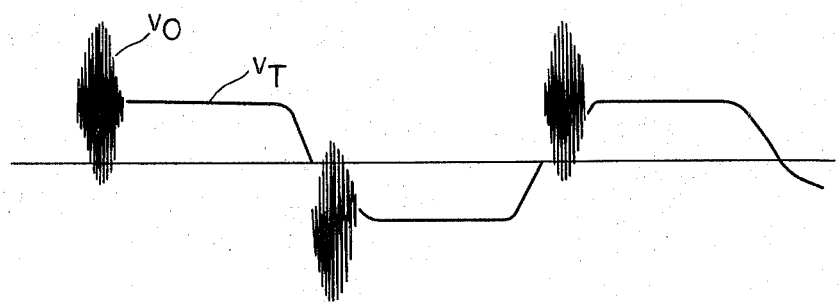
FIG. 2A
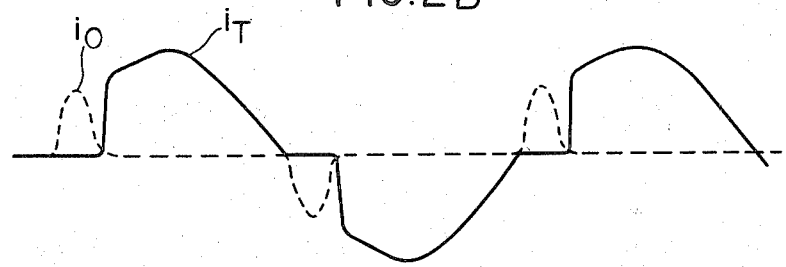
FIG. 2B

CIRCUIT SYSTEM FOR LIGHTING A DISCHARGE LAMP OR LAMPS

CROSS REFERENCE TO RELATED APPLICATIONS

The present application corresponds to Japanese patent applications: (1) 54-173429; (2) 55-52192; and 55-119391; filed in Japan on: (1) Dec. 28, 1979; (2) Apr. 18, 1980; (3) Aug. 28, 1980. The priorities of said Japanese filing dates are hereby claimed.

BACKGROUND OF THE INVENTION

The present invention relates to a circuit system for lighting a discharge lamp or lamps. More specifically, the present invention relates to an improved circuit system for lighting a discharge lamp wherein the discharge is sustained through reignition of the discharge lamp in each half cycle of the alternating current of a low frequency alternating current power supply. Such reignition of a discharge lamp in each half cycle of the alternating current for the purpose of sustaining the discharge may be referred to as a reignition-in-each-cycle system.

Description of the Prior Art

FIG. 1 is a schematic diagram of a conventional circuit system for lighting a discharge lamp employing a reignition-in-each-cycle system. Referring to FIG. 1, a series connection of a linear inductor 2 and a discharge lamp 3 is connected to a commercial alternating current power supply 1. The linear inductor 2 cooperates with the oscillation circuit 5 in each half cycle of the low frequency wave to contribute to the generation of an oscillation output and cooperates with the intermittent oscillating capacitor 6 to increase the discharge lamp current at the beginning of the ignition, while the linear inductor 2 also serves as a ballast for limiting the discharge lamp current after reignition. The linear inductor 2 will be referred to as a choke 2. An intermittent oscillation circuit 4 is connected between the non-power supply ends, i.e. the ends farther from the power supply of the filaments 31 and 32 of the discharge lamp 3.

The above described intermittent oscillation circuit 4 comprises a series connection of an intermittent oscillating capacitor 6 and an oscillation circuit 5 including a series connection of a thyristor 52, which may for example be a current controlled, non-linear resistive element, and a non-linear inductor 53, which series connection is shunted by an oscillating capacitor 51. The above described intermittent oscillation circuit 4 may be replaced by a circuit which employs a gate type thyristor such as a triac or a circuit which employs an inverter, provided that an intermittent high frequency oscillating operation is assured.

The details of the operating principle of such reignition-in-each-cycle system as described above have been described in U.S. Pat. No. 4,079,292 issued Mar. 14, 1978 to the same inventor and assigned to the same assignee as the present invention, apart from a different heating scheme of the filaments of a discharge lamp. Therefore, the operation of the circuit of FIG. 1 will be briefly described herein.

FIGS. 2A and 2B are graphs for describing the operation of the FIG. 1 diagram. FIG. 2A shows the waveforms of a lamp voltage $v_T$ and an oscillation output voltage $v_O$ and FIG. 2B shows the waveforms of a lamp current $i_T$ and an oscillation current $i_O$ of the intermittent oscillation circuit 4.

In operation, when a switch, not shown, of the alternating current power supply 1 is turned on, the power supply voltage is applied through the choke 2 to the discharge lamp 3. At the same time, the power supply voltage is also applied to the intermittent oscillation circuit 4 through the filaments 31 and 32 of the discharge lamp 3. Referring to the intermittent oscillation circuit 4, the power supply voltage is applied through the intermittent oscillating capacitor 6 to the thyristor 52, whereby the thyristor 52 is rendered conductive due to breakover. Therefore, the oscillation circuit 5 starts oscillating. Without the intermittent oscillating capacitor 6, the oscillating operation would have been continuous. However, since the intermittent oscillating capacitor 6 is connected as shown in FIG. 1, the intermittent oscillating capacitor 6 is gradually charged as the oscillation circuit 5 oscillates and during that time period the terminal voltage of the intermittent oscillating capacitor 6 offsets the power supply voltage to keep the thyristor 52 off, whereby the oscillation circuit 5 stops the oscillating operation. As a result, an intermittent oscillating output is generated in a predetermined phase or portion of each half cycle of the alternating current of the power supply voltage.

The oscillation output voltage $v_O$ is superimposed on the power supply voltage and such power supply voltage with the oscillation output voltage $v_O$ superimposed thereon is applied to the discharge lamp 3. At the same time, the oscillation current $i_O$ flows through the current path of the power supply 1—the choke 2—the filament 31—the intermittent oscillation circuit 4—the filament 32, and the power supply 1. The filaments 31 and 32 are preheated by the above described oscillation current $i_O$.

When the filaments 31 and 32 are thus preheated sufficiently, the discharge lamp 3 is ignited upon being triggered by the oscillation output voltage $v_O$ from the intermittent oscillation circuit 4. When the discharge lamp 3 is ignited and lighted, the lamp current $i_T$ of the discharge lamp 3 flows through the choke 2. As a result, the impedance of the choke 2 changes, so that the time period of the oscillation current $i_O$ becomes shorter than that during the above described preheating operation. During the rest period of the input current, the intermittent oscillation circuit 4 stops its oscillating and the filaments 31 and 32 also stop being preheated and accordingly the preheating current is decreased when the discharge lamp 3 is lighted.

Thereafter, the discharge lamp 3 is reignited by the oscillation output of the intermittent oscillation circuit 4 in each half cycle of the alternating current of the power supply 1, whereby the lighting or discharge of the discharge lamp 3 is sustained by the power supply voltage.

The lamp voltage $v_T$ becomes a substantially rectangular wave form of an intermittent oscillation having a rest period, thereby to exhibit a lower effective value as compared with that of a conventional discharge lamp lighting system. On the other hand, since the intermittent input current of the intermittent oscillation circuit 4 flows through the choke 2, the lamp voltage $v_T$ is slightly enhanced under the influence of the oscillation current $i_O$. The phase of occurrence of the oscillation current $i_O$ remains constant irrespective of any fluctuation of the power supply voltage and accordingly the rising phase of the lamp current $i_T$ is maintained constant irrespective of the fluctuation of the power supply voltage. On the other hand, the above described oscillation current $i_O$ exhibits such a characteristic that if the lamp current $i_T$ increases due to an increase of the power supply voltage e the trailing end of the lamp current waveform overlaps the period of the oscillation current $i_O$ of the subsequent half cycle so that the oscillation current $i_O$ is decreased. More specifically, the oscillation current $i_O$ has a negative fluctuation coefficient. These are the reasons why stability of the lamp current $i_T$ in the reignition-in-each-cycle system is excellent irrespective of a descrease in a stabilizing impedance.

The energy stored in the choke 2 and the necessary inductance of the choke 2, when the same are calculated on the basis of actually measured values, are reduced to 20% to 25% as compared to the respective values of a conventional glow lighting system. Hence, such a lighting circuit system can be miniaturized. As compared to a stabilizer used in a rapid start type lighting system including a boosting transformer, the above described discharge lamp lighting circuit system can be made much more compact.

Furthermore, since the reignition-in-each-cycle system shows a phase difference between the power supply voltage and the lamp current which is smaller than that of the conventional discharge lamp lighting system, a power factor improving capacitor is not required or may be of a very small capacitance value. Further, the above described conventional discharge lamp lighting system, is a system in which the discharge lamp is energized by a glow starter or an electronic starter only at the beginning of the operation of the discharge lamp and after the lamp is lighted the discharge is sustained by the power supply voltage.

Thus, a system for igniting a discharge lamp in each cycle brings about many and various advantages from the standpoint of saving materials and energy.

However, since such reignition-in-each-cycle system exhibits a small impedance across the oscillation circuit 5 during the oscillation period thereof, the secondary side of the discharge lamp 3 becomes short-circuited during the oscillation phase. Therefore, during that period or phase the discharge lamp 3 is not supplied with a lamp current from the low frequency alternating current power supply 1. Hence, current lacking portions occur as shown in FIG. 2B in the lamp current $i_T$ whereby the overall efficiency of the lighting device is decreased.

Furthermore, generally the discharge lamp 3 exhibits a negative characteristic when its lit condition is sustained by a commercial power supply, as is clear from the relation of the lamp voltage $v_T$ as a function of the lamp current $i_T$ shown in FIG. 3. When the discharge lamp 3 exhibits a negative characteristic, the choke 2 becomes necessary, which increases the size and the weight of the apparatus.

Furthermore, when the ambient temperature is high, the lamp current $i_T$ increases and accordingly the lamp voltage $v_T$ decreases, with the result that the discharge lamp 3 may be reignited by the power supply voltage. In the event that the discharge lamp is reignited by the alternating current power supply voltage before the intermittent oscillation circuit 4 begins an intermittent oscillating phase, a change of the mode of operation occurs from a reignition-in-each-cycle lighting mode to a conventional lighting mode, whereby a flickering phenomenon occurs and a stabilized lit operation of the discharge lamp 3 is not achieved.

However, the discharge lamp can be made to have a more or less but not completely positive characteristic even when the reignition-in-each-cycle lighting system is employed. FIG. 4 is a graph showing the relation between the lamp voltage $v_T$ and the lamp current $i_T$ whereby the frequency of the power supply voltage applied to the discharge lamp 3, is a changing parameter $f_1$ to $f_5$. As is clear from FIG. 4, the discharge lamp 3 exhibits a negative characteristic where the power supply voltage has a low frequency ($f_1$; $f_2$, $f_3$) and it exhibits a positive characteristic as the frequency of the power supply voltage is increased to $f_4$, $f_5$. It is well known that malfunction of the discharge lamp 3 can be prevented and a stabilizer can be dispensed with or can be made extremely compact, if the discharge lamp 3 exhibits a positive characteristic. However, a conventional high frequency power supply is rather complicated in structure and expensive in cost.

Furthermore, while the above described reignition-in-each-cycle lighting system has excellent advantages as compared to a conventional lighting system, a problem is still involved in that the lamp current $i_T$ fluctuates when the power supply voltage of the alternating current power supply 1 and the ambient temperature fluctuate. Therefore, it was required to employ a choke 2 using copper wires of substantial diameter to prevent damage of the choke 2 due to an increase of the lamp current $i_T$. Accordingly, in order to allow for fluctuations of the power supply voltage and an increased ambient temperature range, as a matter of practice, the choke 2 could only be reduced in size to about one half of that used in a conventional glow lamp lighting system. Therefore, in order to miniaturize the choke 2, one might think of improving a fluctuation ratio. Such fluctuation ratio can be improved and the choke 2 can be made compact by making the intermittent oscillation period longer in the case where the power supply voltage increases, for example. However, the impedance of the discharge lamp 3 decreases due to the glow discharge during the intermittent oscillation period, as described above. Therefore, only a small high frequency current flows through the discharge lamp 3. As a result, another disadvantage is involved that when the intermittent oscillation period is made longer the overall efficiency of the lighting device decreases.

SUMMARY OF THE INVENTION

The present invention is directed to a reignition-in-each-cycle system adapted for reigniting a discharge lamp with a high frequency voltage intermittently generated in each half cycle of the alternating current of a low frequency alternating current power supply and the lighting or discharge of the discharge lamp is sustained with the alternating current voltage after the discharge lamp is reignited. According to the invention such a system is characterized by means for controlling the supplied energy by controlling a high frequency component of the energy supplied to the discharge lamp whereby the overall efficiency of the lighting device and, depending on the situation, the power factor thereof, are improved. For example, the supplied energy controlling means comprises an impedance for effectively supplying a high frequency current so as to fill the lacking portion of the illuminating portion due to lack of a low frequency lamp current, matching means for coupling a high frequency power component to the discharge lamp with a predetermined waveform, or the like.

According to the present invention, the low frequency current is caused to flow from the low frequency alternating current power supply to the discharge lamp even during the generation of the high frequency voltage, whereby a discharge lamp lighting circuit system results which has a controlled energy supply.

In a preferred embodiment of the present invention, the ratio of the high frequency electric power to the low frequency electric power is enhanced, whereby the discharge lamp is operated with a positive characteristic as shown at $f_4$ and $f_5$ in FIG. 4, with the result that the lighting operation of the discharge lamp is stabilized and the ballast may be miniaturized or even dispensed with.

In another preferred embodiment of the present invention, a matching means is provided between an intermittent high frequency high voltage generating means for generating a high frequency voltage upon being energized by the low frequency alternating current power supply and the discharge lamp. The internal impedance of the intermittent high frequency high voltage generating means and the external impedance including the matching means and the discharge lamp are matched by means of the above described matching means, whereby the efficiency of generating the intermittent high frequency voltage and the efficiency of the discharge lamp are enhanced.

Accordingly, a principal object of the present invention is to provide an improved discharge lamp lighting circuit system for enhancing its efficiency.

Another object of the present invention is to provide a discharge lamp lighting circuit system, wherein the lighting operation of the discharge lamp is stabilized and the fluctuation ratio is improved.

A further object of the present invention is to provide the discharge lamp lighting circuit system, wherein a ballast can be made of small size or can be dispensed with altogether, thereby to enable fabrication of the system at low cost.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram of a reignition-in-each-cycle system which constitute the background of the invention;

FIGS. 2A and 2B are graphs showing the waveforms for explaining the operation of the diagram of FIG. 1;

FIG. 3 is a graph showing the relation between the lamp voltage ($v_T$) and the lamp current $i_T$;

DETAILED DESCRIPTION OF PREFERRED EXAMPLE EMBODIMENTS AND OF THE BEST MODE OF THE INVENTION

Figure 4:
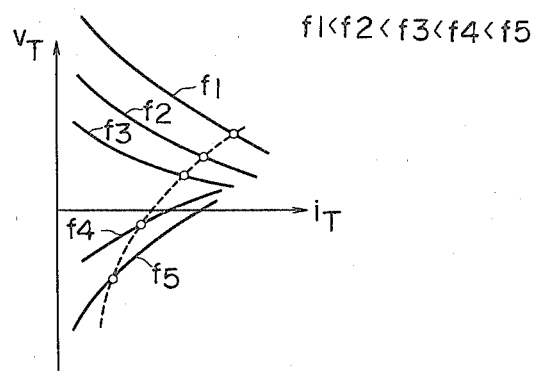
FIG. 4 is a graph showing the relation between the lamp voltage ($v_T$) and the lamp current ($i_T$) in the case where the frequency of the voltage being applied to the discharge lamp, is a changing parameter.
Figure 5:
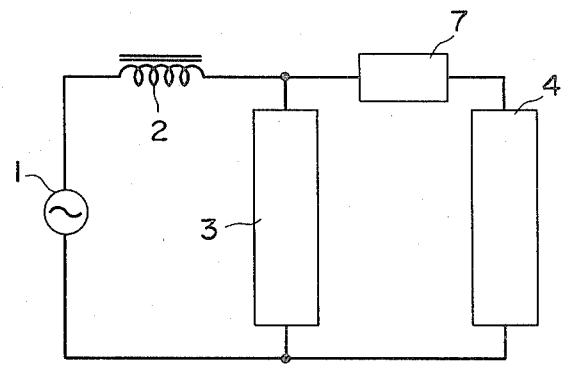
FIG. 5 is a block diagram showing the principle of the present invention.

FIG. 5 is a block diagram showing the principle of the present invention. A series connection of a choke 2 and a discharge lamp 3 is connected to a low frequency alternating current power supply 1. A series connection of an intermittent oscillation circuit 4 and a supplied energy controlling means 7 is connected in parallel to the discharge lamp 3. The supplied energy controlling means 7 is provided for controlling a high frequency component of the energy supplied to the discharge lamp whereby the overall efficiency of the lighting device and, depending on the situation, the power factor thereof, are improved. For example, the supplied energy controlling means 7 may comprise an impedance for effectively supplying a high frequency current so as to fill the lacking portion of the illuminating portion due to lack of a low frequency lamp current, or matching means for coupling a high frequency component power to the discharge lamp with a predetermined waveform, or the like may be used. Although FIG. 5 shows a case where the series connection of the intermittent oscillation circuit 4 and the supplied energy controlling means 7 is connected in parallel with the discharge lamp 3, depending on the structure of the supplied energy controlling means 7, a parallel connection of the intermittent oscillation circuit 4 and the supplied energy controlling means 7, may be connected in parallel to the discharge lamp 3.

Figure 6:
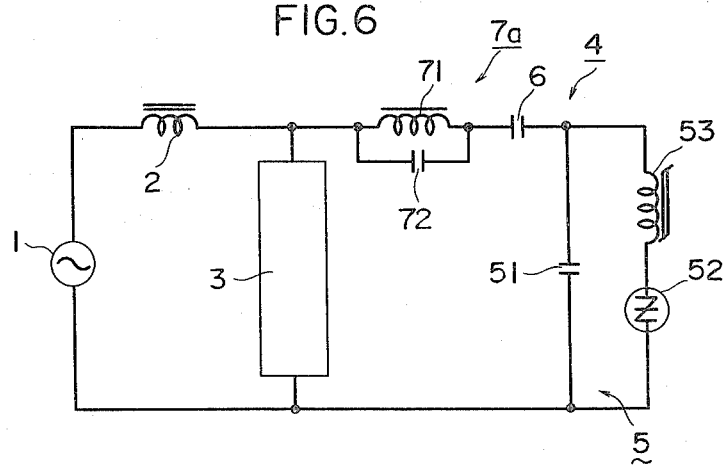
FIG. 6 is a schematic diagram of one embodiment of the present invention.

One specific example of the above described supplied energy controlling means 7 may be an impedance means 7a, shown in FIG. 6 for example. More specifically, the impedance means 7a supplies a high frequency current generated by the intermittent oscillation circuit 4 to the discharge lamp 3 and it also prevents the secondary side of the discharge lamp 3 as viewed from the low frequency alternating current power supply 1, from being short-circuited. This short circuiting is prevented by an increased impedance exhibited with respect to the frequency of the low frequency alternating power supply when the intermittent oscillation circuit 4 oscillates.

FIG. 6 is a schematic diagram showing one embodiment of the present invention. A series connection of the choke 2 and the discharge lamp 3 is connected to the low frequency alternating current power supply 1. A series connection of the intermittent oscillation circuit 4 and the impedance means 7a is connected in parallel to the discharge lamp 3. The intermittent oscillation circuit 4 may be the same as described above with reference to FIG. 1. The impedance means 7a comprises a parallel connection of a low frequency restricting inductor 71 and a high frequency passing capacitor 72.

Figure 7A:
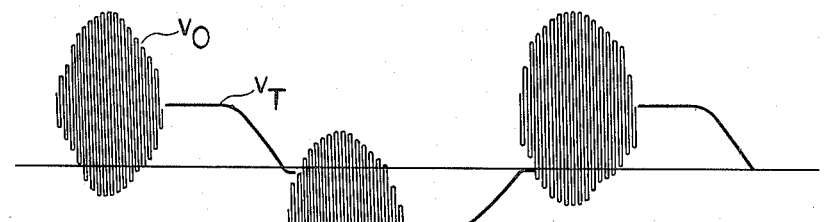
FIGS. 7A and 7B are graphs showing the waveforms of the lamp voltage ($v_T$), the oscillation output voltage ($v_O$), the lamp current ($i_T$), and the oscillation current ($i_O$) of the intermittent oscillation circuit, for explaining the operation of the embodiment of FIG. 6.
Figure 7B:
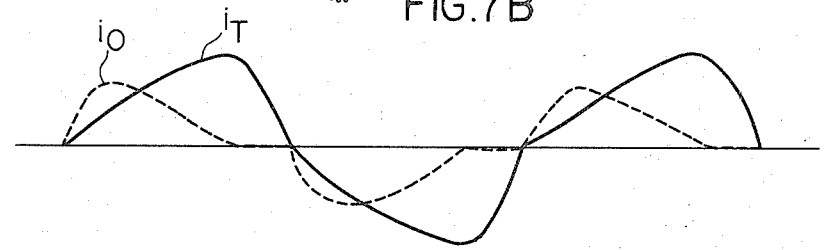

FIGS. 7A and 7B are graphs showing the waveforms for explaining the operation of the above described embodiment. In FIG. 7A, the a waveform $v_O$ shows the oscillation output of the intermittent oscillation circuit 4 and the waveform of the $v_T$ shows the lamp voltage. In FIG. 7B, the waveform $i_T$ shows the lamp current and the waveform $i_O$ shows the oscillation current of the intermittent oscillation circuit 4.

In operation, when the alternating current power supply 1 is turned on, a low freuqency current flows through the path of the alternating current power supply 1—the choke 2—the low frequency restricting inductor 71—the intermittent oscillating capacitor 6—the oscillating capacitor 51—and back to the alternating current power supply 1. The above described low frequency current charges the oscillating capacitor 51. If and when the terminal voltage of the oscillating capacitor 51 exceeds a breakover voltage $v_{BO}$ of a thyristor 52 shown as one example of a current controlled type non-linear resistive element, the thyristor 52 is rendered conductive. Accordingly, the oscillating capacitor 51 and a non-linear inductor 53 cooperate to cause a high frequency oscillation. The oscillation voltage of the oscillation circuit 5 is applied through the intermittent oscillation capacitor 6 and the high frequency transferring capacitor 72, to both ends of the discharge lamp 3. During the above described oscillating operation period of the intermittent oscillation circuit 4, the low frequency current flows from the alternating current power supply 1 through the choke 2 and the low frequency restricting inductor 71 to the intermittent oscillation circuit 4. However, since the low frequency restricting inductor 71 exhibits a certain impedance with respect to the frequency of the alternating current power supply 1, it prevents the secondary side of the discharge lamp 3 from being short-circuited. The discharge lamp 3 is triggered by the oscillation voltage of the oscillation circuit 5 to be ignited, whereby a relatively small lamp current $i_T$ flows through the discharge lamp 3. Such oscillating operation of the oscillation circuit 5 could have continued without the intermittent oscillating capacitor 6. However, since the intermittent oscillating capacitor 6 is provided, which is charged by the oscillating current, the above described intermittent oscillating capacitor 6 gradually exhibits a high impedance, whereby the oscillation current $i_O$ flowing to the intermittent oscillation circuit 4 gradually decreases and conversely the lamp current $i_T$ flowing into the discharge lamp 3 gradually increases. The capacitance value of the intermittent oscillating capacitor 6 is selected so that the oscillation period of the intermittent oscillation circuit 4, i.e. the flow period of the oscillation current $i_O$ covers at least the increasing or rising period of the lamp current $i_T$, see FIG. 7b. After the completion of the oscillating operation of the intermittent oscillation circuit 4, the lamp current $i_T$ gradually decreases.

Thereafter, at each half cycle of the alternating current of the a.c. power supply 1, the low frequency input current from the a.c. power supply 1 is superimposed on the high frequency current and the composite current flows into the discharge lamp 3. As a result, the current lacking portion of the lamp current $i_T$ if filled, whereby the efficiency is enhanced. The mixing ratio of the high frequency electric power and the low frequency electric power being supplied to the discharge lamp 3 is increased, whereby the discharge lamp 3 exhibits a positive characteristic. Accordingly, the choke 2 it can be of dispensed with or it can be of considerably smaller size.

As described in the foregoing, according to the embodiment, of FIG. 6 the low frequency lamp current being supplied by the a.c. power supply 1 to the discharge lamp 3, is gradually increased from the start of the oscillation of the intermittent oscillation circuit 4, whereby the high frequency current and the low frequency current are superimposed and supplied to the discharge lamp 3, whereby the advantage is achieved that the discharge lamp 3 always operates with a positive characteristic and its efficiency is enhanced. Furthermore, since the discharge lamp 3 can be made to exhibit a positive characteristic, a further advantage is seen in that the choke 2 can be dispensed with or can be of considerably smaller size. Still another advantage is seen in that since the intermittent oscillation circuit 4 becomes positively operable earlier even when the ambient temperature is abnormal for example abnormally high, and the discharge lamp 3 is reignited at a predetermined phase of each half cycle of the alternating current of the a.c. power supply, the discharge lamp 3 is stably ignited or lighted in a reignition-in-each-cycle fashion whereby the flickering phenomenon is prevented. In addition, since the supply of the high frequency electric power is discontinued in a decreasing period of the lamp current $i_T'$, the electric power loss is reduced and the life of the discharge lamp 3 is prolonged.

Figure 8A:
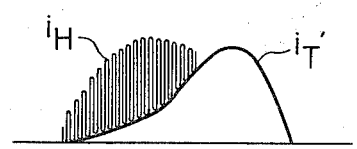
FIGS. 8A and 8B are graphs showing the waveforms of the low frequency lamp current ($i_T'$), the high frequency lamp current ($i_H$) and the oscillation output voltage ($v_O$) in the case where the high frequency lamp current ($i_H$) is superimposed on the low frequency lamp current ($i_T'$) in a plus polarity manner.
Figure 8B:
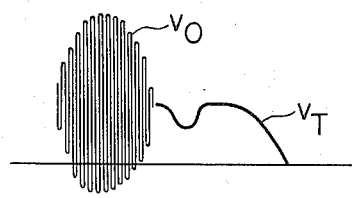
Figure 9A:
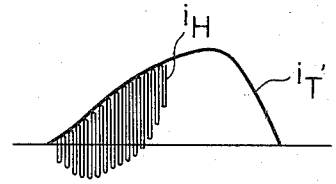
FIGS. 9A and 9B are graphs showing the waveforms of the low frequency lamp current ($i_T'$), the high frequency lamp current ($i_H$), the lamp voltage ($v_T$) and the oscillation output voltage ($v_O$) in the case where the high frequency lamp current ($i_H$) is superimposed on the low frequency lamp current ($i_H'$) in a minus polarity manner.
Figure 9B:
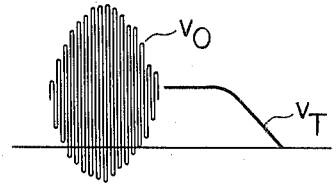

When the high frequency lamp current $i_H$ from the intermittent oscillation circuit 4, is added in a plus polarity manner to the low frequency lamp current $i_T'$ flowing from the alternating current power supply 1 as shown in FIG. 8A, a valley portion occurs in the lamp voltage $v_T$ as shown in FIG. 8B. Conversely, in the case where the high frequency lamp current $i_T$ is added in a minus polarity manner to the low frequency lamp current $i_T'$ as shown in FIG. 9A, a valley portion does not occur in the lamp voltage $v_T$ as shown in FIG. 9B.

Figure 10:
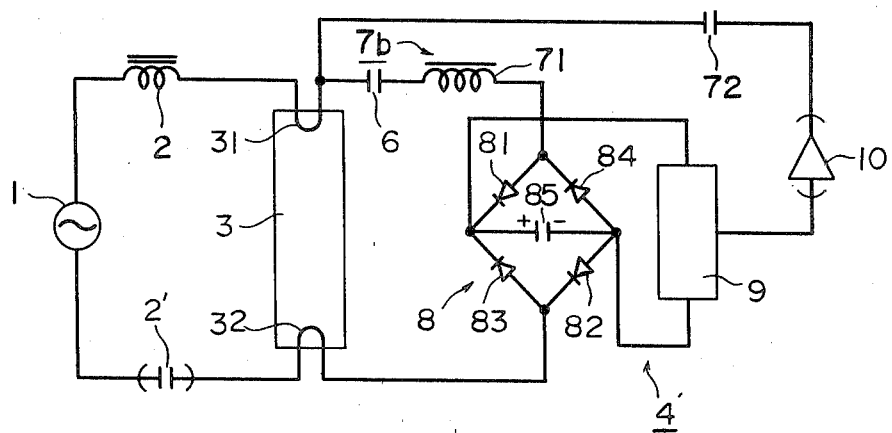
FIGS. 10, 11 and 13 are schematic diagrams showing further different embodiments of the present invention.

FIG. 10 is a schematic diagram of another embodiment of the present invention. A series connection of the choke 2 and the discharge lamp 3 of a hot cathode type is connected in parallel with the low frequency a.c. power supply 1. A series connection of the intermittent oscillating capacitor 6, the low frequency restricting inductor 71 and a diode bridge full-wave rectifying circuit 8 is connected in parallel to the discharge lamp 3 at the secondary side of the filaments 31 and 32 of the discharge lamp 3. The rectifying circuit 8 comprises diodes 81 to 84 connected as a bridge rectifier. A capacitor 85 and a transistor inverter 9 are connected in parallel to the rectifying circuit 8 at the output terminals thereof. The output of the transistor inverter 9 is connected to the secondary side or non-power supply side of the filaments through a high frequency transferring capacitor 72 or a series connection of a high frequency transferring capacitor 72 and an amplifying circuit 10. More specifically, in the embodiment shown an intermittent oscillation circuit 4' comprises the intermittent oscillating capacitor 6, the transistor inverter 9, and an impedance means 7b including only the low frequency restricting inductor 71.

In operation, when the alternating current power supply 1 is turned on in the circuit of FIG. 10, a low frequency current flows from the a.c. power supply 1 through the path of the choke 2—the filament 31—the intermittent oscillating capacitor 6—the low frequency restricting inductor 71—the diode 81—the capacitor 85—the diode 82—the filament 32—back to the alternating current power supply, thereby to charge the capacitor 85 with the polarity indicated in the drawing. The low frequency current is in a full-wave manner rectified by the rectifying circuit 8 and the rectifier output charges the capacitor 85 in one polarity. The direct current voltage thus produced is smoothed and applied to the transistor inverter 9. Accordingly, the transistor inverter converts the direct current voltage into a high frequency voltage, which is applied through the high frequency transferring capacitor 72 or the series connection of the high frequency transferring capacitor 72 and the amplifying circuit 10, to the filament 31 of the discharge lamp 3. The filaments 31 and 32 of the discharge lamp 3 are preheated by a sum current of the charging current of the above described capacitor 85 and the input current of the transistor inverter 9. When the filaments 31 and 32 are sufficiently preheated, the discharge lamp 3 is triggered with a high frequency voltage and is ignited or lit. After the discharging lamp 3 has been lit, the discharge lamp 3 is reignited by the high frequency voltage from the transistor inverter 9. The lamp current supplied by the a.c. power supply 1 to the discharge lamp 3 gradually increases, while the input current to the full-wave rectifying circuit 8 gradually decreases due to the fact that the intermittent oscillating capacitor 6 is charged with the input current to the transistor inverter 9. The discharge lamp 3 is kept lit only by the power supply voltage after the intermittent oscillating operation of the transistor inverter 9 is terminated as a function of the intermittent oscillating capacitor 6. Thereafter the above described operation is repeated for each half cycle of the a.c. of the alternating current power supply 1.

Since the high frequency current is supplied in superposition on the low frequency alternating current during the increasing period of each half cycle of the lamp current even in the case of the above described embodiment, the discharge lamp may be operated with a positive characteristic and hence a stabilized lighting operation is achieved, the efficiency is enhanced, and in addition the choke 2 is dispensed with or can be miniaturized considerably. Furthermore, in the above described embodiment the input voltage of the transistor inverter 9 may be proportional to the lamp voltage of the discharge lamp 3. Hence, an increase of the lamp current due to a fluctuation of the power supply voltage and a fluctuation of the ambient temperature and thus a decrease of the lamp voltage results in a decrease of the input current of the transistor inverter 9. Accordingly, the inverter 9 decreases the high frequency output, so that the lamp current is reduced whereby the lamp current may be kept substantially constant.

Figure 11:
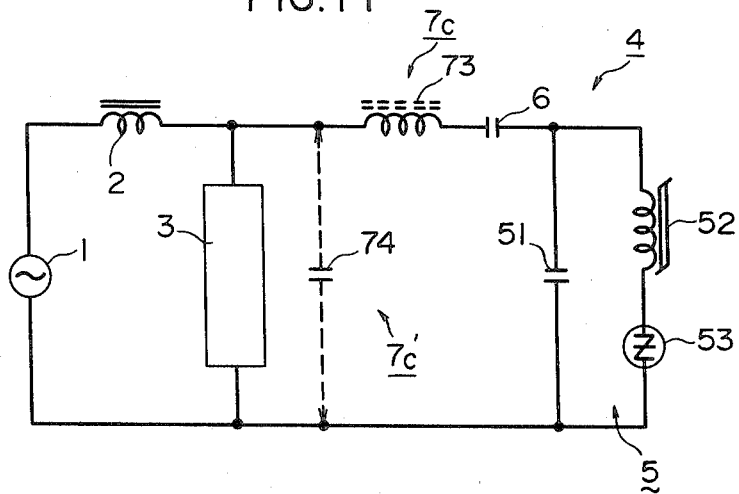

FIG. 11 is a schematic diagram of a further embodiment of the present invention. FIG. 11 differs from the embodiments described with reference to FIGS. 6 and 10 in that a matching means 7c is employed in place of the impedance means 7a or 7b. Since the intermittent oscillation circuit 4 is a high frequency power supply FIG. 11 takes into consideration that, the output of the high frequency power supply 4, which is supplied to the discharge lamp 3, reaches its maximum when the internal impedance Zs of the high frequency power supply 4 and the external impedance Zl including the matching means 7c and the discharge lamp 3, are substantially the same so that both may be matched to each other.

More specifically, a high frequency inductor 73 is connected between the discharge lamp 3 and the intermittent oscillation circuit 4. Such an inductor 73 is another example of the matching means 7c for controlling the supplied energy.

The impedance Zl of the above described high frequency inductor 73 is selected such that the total value Zl of the impedance Zl and the impedance of the discharge lamp 3 may be commensurate to the internal impedance Zs of the intermittent oscillation circuit 4. The high frequency inductor 73 and the intermittent oscillating capacitor 6 constitute a resonance circuit, which causes the resonant operation of the oscillation circuit 5. More specifically, since the external impedance Zl given as the sum of the impedance Zl of the high frequency inductor 73 and the impedance of the discharge lamp 3 can be made equal to the internal impedance Zs of the intermittent oscillation circuit 4 through the resonance by the high frequency inductor 73 and the intermittent oscillating capacitor 6, the intermittent oscillating output voltage from the intermittent oscillation circuit 4 can be enhanced. Thus, according to the embodiment shown in FIG. 11 an ample high frequency current may flow through the discharge lamp 3 even during the intermittent oscillating period and hence the overall efficiency of the lighting device can be enhanced, although in the conventional system little high frequency current flowed during the intermittent oscillating period. Accordingly, even when the capacitance of the intermittent oscillating capacitor 6 is increased to expand the intermittent oscillating period for the purpose of improving the fluctuation ratio, a high frequency current may be supplied to the discharge lamp 3 during the intermittent oscillating period and the fluctuation ratio may be improved without degrading the overall efficiency of the lighting device.

The invention is not limited to matching means in the form of a high frequency inductor. Rather, various modifications and changes may be made without departing from the teaching of the present invention. For example, the matching means may comprise a capacitor 74, shown by the dotted line in FIG. 11, connected in parallel to the discharge lamp 3, so that an L-type circuit may be established with the high frequency inductor 73 and the capacitor 74. In such an embodiment, an intermittent oscillating output voltage of the intermittent oscillation generating circuit 4 may be enhanced by selecting the external impedance Zl including the capacitor 74 and the discharge lamp 3 to be equal to the internal impedance Zs of the intermittent oscillation circuit 4, as described above in conjunction with FIG. 11.

If there is a leakage of magnetic flux from the high frequency inductor 73, a tank circuit is constituted for the leaking magnetic flux by the capacitor 74. Such a tank circuit shapes the waveform of the pulsing intermittent oscillating output voltage as shown in FIG.

Figure 12A:
FIGS. 12A and 12B are graphs showing the waveform of the oscillation output voltage ($v_O$) for explaining the operation of the embodiment of FIG. 11.
Figure 12B:
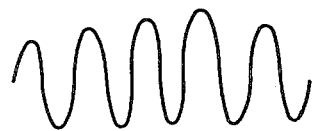

12A, into a sinusoidal waveform as shown in FIG. 12B. As a result, another advantage is seen in that the overall efficiency of the lighting device for the discharge lamp 3 is further enhanced.

Figure 13:
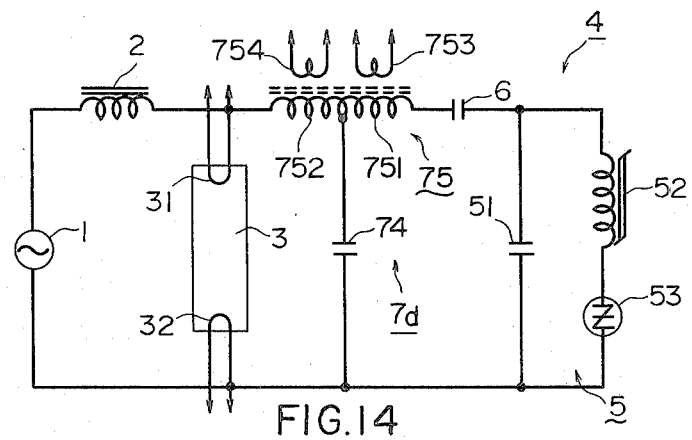

FIG. 13 is a schematic diagram of a further embodiment of the present invention. FIG. 13 differs from FIG. 11 in that a T-type circuit 7d comprising a high frequency transformer 75 and a capacitor 74, is employed in place of the matching means 7c. The high frequency transformer 75 comprises a primary winding 751, a secondary winding 752, and filament windings 753 and 754 which are magnetically coupled to each other. The filaments 31 and 32 of the discharge lamp 3 of a hot cathode type are preheated by a voltage induced on the filament windings 753 and 754. The turn ratio (N2/N1) of the high frequency transformer 75 is selected such that the internal impedance Zs of the intermittent oscillation circuit 4 may be commensurate with or equal to the external impedance Zl including the discharge lamp 3. Thus, the intermittent oscillating output voltage of the intermittent oscillation circuit 4 is enhanced. If and when the turn ratio of the high frequency transformer 75 is selected to be sufficiently large, a boosted intermittent oscillating output voltage may be obtained in the secondary winding 742 of the high frequency transformer 75 and therefore a starting and reigniting voltage of the discharge lamp 3 can be increased.

Figure 14:
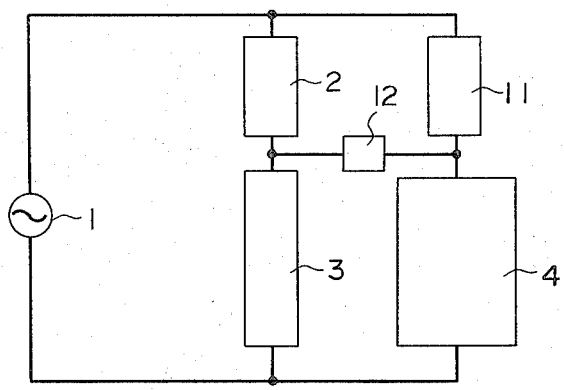
FIG. 14 is a block diagram showing the principle of a further embodiment of the present invention.

FIG. 14 is a block diagram showing another principle of the present invention wherein a series connection of the choke 2 and the discharge lamp 3 is connected to the low frequency a.c. power supply. Another series connection of the intermittent oscillation circuit 4 and a high frequency blocking means 11 is connected in parallel with the previously described series connection of the choke 2 and the discharge lamp 3. A high frequency transferring means 12 is interposed between the junction of the choke 2 and the discharge lamp 3, and the junction of the high frequency blocking means 11 and the intermittent oscillation circuit 4.

Figure 15A:
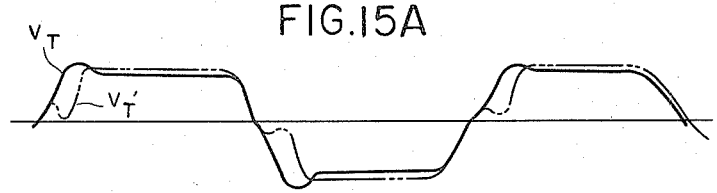
FIGS. 15A and 15B are waveforms for explaining the operation of the principle of the diagram of FIG. 14.
Figure 15B:
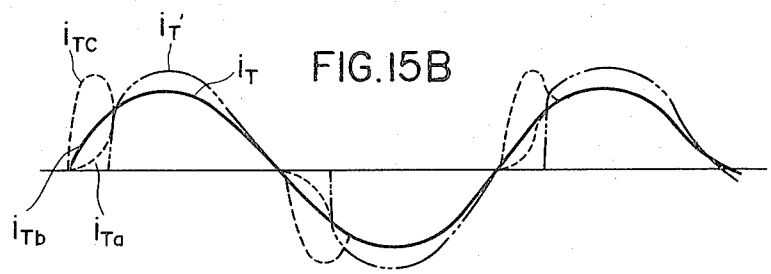

FIGS. 15A and 15B are graphs for explaining the principle of operation of the FIG. 14 embodiment. FIG. 15A shows a waveform of the lamp voltage $v_T$ and FIG. 15B shows a waveform of the low frequency component of the lamp current $i_T$. The waveforms $v_T'$ and $i_T'$ shown by the two dotted lines refer to a reignition in each cycle described with reference to FIG. 1 and the solid line shows low frequency components of the lamp voltage $v_T$ and the lamp current $i_T$ obtained by the FIG. 14 embodiment.

When the intermittent oscillation circuit 4 oscillates as described with reference to FIG. 1, an intermittent output voltage is supplied through the high frequency transferring means 12 to the discharge lamp 3. Accordingly, the discharge lamp 3 is ignited, started, or lit. After the start or ignition of the discharge lamp 3 in the circuit of FIG. 14 the power supply voltage is applied to the discharge lamp 3 even during the operation of the intermittent oscillation circuit 4 because in FIG. 14 the igniting circuit for the discharge lamp 3 and the intermittent oscillation circuit 4 are separated. This is not so in FIG. 1. Accordingly, in FIG. 14 the high frequency current is supplied to the discharge lamp 3 during the operation of the intermittent oscillation circuit 4. At the same time, the low frequency current from the a.c. power supply 1 is supplied to the discharge lamp 3 through the choke 2. Therefore, a current lacking period of the lamp current $i_T$ is eliminated in the intermittent operating period, as shown in FIG. 15B. Furthermore, the lamp voltage $v_T$ of the discharge lamp 3 is enhanced as shown by the solid line $v_T$ in FIG. 15A without a drop in the rise portion thereof as in the case of the lamp voltage $v_T'$ shown in FIG. 15A for the reignition-in-each-cycle system of FIG. 1. Therefore, the ignition efficiency is enhanced in a system as shown in FIG. 14. On the other hand, the peak value of the lamp current $i_T$ is decreased as compared with $i_T'$ of the reignition-in-each-cycle system of FIG. 1, see FIG. 15B. Hence the size of the choke 2 may be further reduced.

Figure 16:
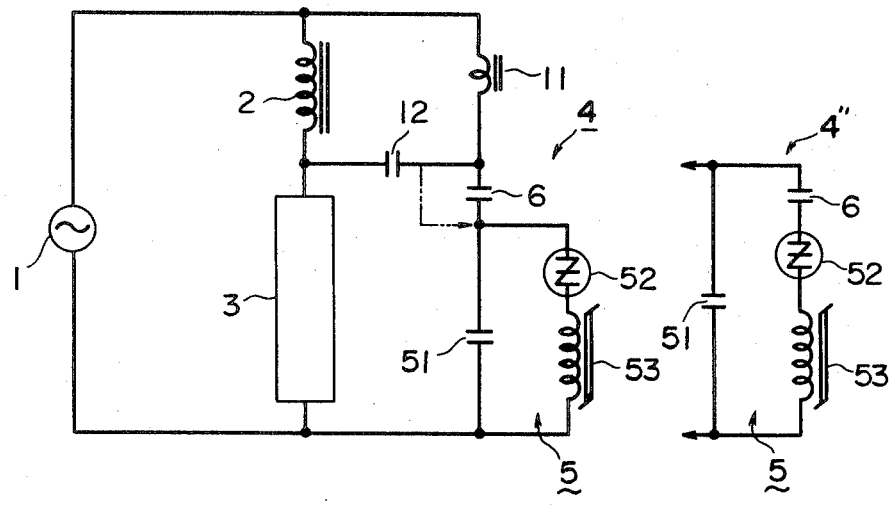
FIGS. 16, 17, 18 and 19 are schematic diagrams of specific embodiments of the principle embodied in FIG. 14.

The low frequency lamp current is determined by the output of the intermittent oscillation circuit 4 and/or by the voltage applied to the discharge lamp 3, during the operating period of the intermittent oscillation circuit 4. If the low frequency lamp current is increased during the operation of the intermittent oscillation circuit 4 by approximately 4% as shown at $i_{Ta}$ in FIG. 15B, the overall efficiency of the lighting device can be enhanced by approximately 7%. Furthermore, if the lamp current is increased by approximately 10% as shown at $i_{Tb}$ in FIG. 15B, the overall efficiency of the lighting device can be enhanced by approximately 12%. If the lamp current is increased to be larger than the peak value of the lamp current as shown at $i_{Tc}$ in FIG. 15B during the intermittent oscillating period, the overall efficiency of the lighting device can be enhanced by approximately 20%. In the embodiment of FIG. 16, any inconveniences are eliminated even if the duration of the intermittent oscillating period, which so far was minimized for enhancing the overall efficiency of the lighting device, is increased whereby the fluctuation ratio of the lamp current can be improved by increasing the high frequency component of the lamp current, for example.

FIG. 16 is a schematic diagram of one specific embodiment of the block diagram of FIG. 14. Comparing FIG. 16 with FIG. 14, the choke 2 in FIG. 16 is an inductance and the intermittent oscillation circuit 4 comprises an oscillation circuit 5 including a series connection of a non-linear inductor 53 and a thyristor 52 shunted by an oscillating capacitor 51. The oscillation circuit 5 is connected in series with the intermittent oscillating capacitor 6. The high frequency blocking means comprise an inductance 11. The high frequency transferring means comprise a capacitor 12.

In operation, when the a.c. power supply 1 is turned on, the low frequency current flows from the a.c. power supply 1 through the inductor 11-the intermittently oscillating capacitor 6 and the oscillating capacitor 51 back to the a.c. power supply 1, whereby the oscillating capacitor 51 is charged. When the terminal voltage of the oscillating capacitor 51 exceeds a breakover voltage of the thyristor 52, the thyristor 52 becomes conductive. Accordingly, the oscillating capacitor 51 and the non-linear inductor 53 cooperate with each other in starting an oscillating operation of the oscillation circuit 5 for generating a high frequency voltage. In such a circuit the oscillation of the circuit 5 would continue without the intermittently oscillating capacitor 6. However, the intermittently oscillating capacitor 6 is gradually charged as the oscillation circuit 5 oscillates, so that the terminal voltage thereof offsets the power supply voltage. As a result, at a certain point of time the thyristor 52 remains switched off or becomes non-conductive, whereby the oscillation circuit 5 stops oscillating. Thereafter, the above described operation is repeated for each half cycle of the a.c. of the alternating current power supply 1 and the oscillation output voltage $v_O$ is intermittently generated at a predetermined phase of each half cycle of the a.c. voltage from the intermittent oscillation circuit 4.

The oscillation output voltage $v_O$ is applied to the discharge lamp 3 through the capacitor 12, whereby the discharge lamp 3 is started. After the start of the discharge lamp 3, the intermittent oscillation circuit 4 intermittently generates the oscillation output voltage $v_O$ at a predetermined phase in each half cycle of the a.c. power supply voltage. As a result, the discharge lamp 3 is reignited through the capacitor 12 by the oscillation output voltage $v_O$. Therefore, for the same reasons as described above, the low frequency current flows in the discharge lamp 3 during the operation of the intermittent oscillation circuit 4. After reignition of the discharge lamp 3 its lit condition is sustained by the voltage from the a.c. power supply 1.

Referring further to FIG. 16, one end of the capacitor 12 may be connected to the junction of the oscillation circuit 5 and the intermittently oscillating capacitor 6, as shown by the dash dotted line. Alternatively, an intermittently oscillation circuit 4" having the intermittent oscillating capacitor 6 connected in series with the thyristor 52 of the oscillation circuit 5 may be employed in place of the circuit 4.

Figure 17:
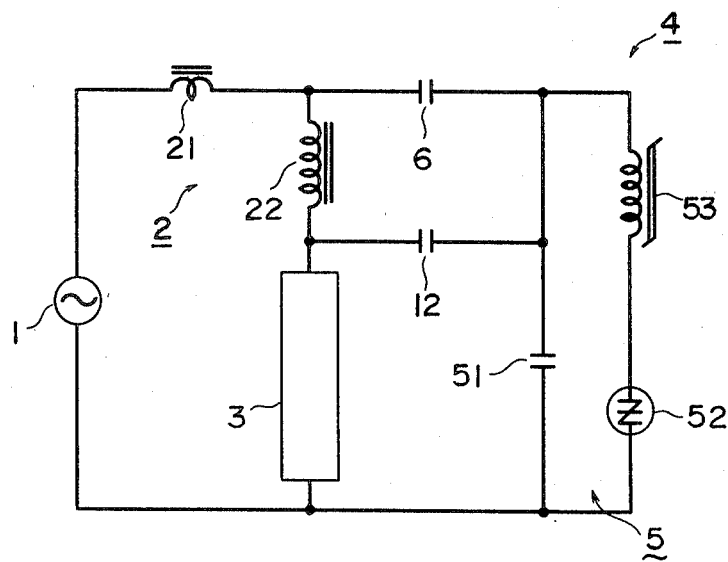

FIG. 17 is a schematic diagram of a practical modification of FIG. 16. FIG. 17 differs from FIG. 16 in that the choke 2 of the discharge lamp 3 comprises a series connection of a first inductor 21 and a second inductor 22 and the intermittent oscillation circuit 4 is connected in parallel to the series connection of the second inductor 22 and the discharge lamp 3. Thus, the first inductor 21 serves also as the inductor 11 namely, as a high frequency blocking means. The inductance ratio of the first inductor 21 and the second inductor 22 is selected to be approximately 2 to 8, for example. Accordingly, the low frequency voltage applied to the discharge lamp 3 during the operation of the intermittent oscillation circuit 4 slightly decreases as compared to the embodiment of FIG. 16 but performs substantially the same operation.

Figure 18:
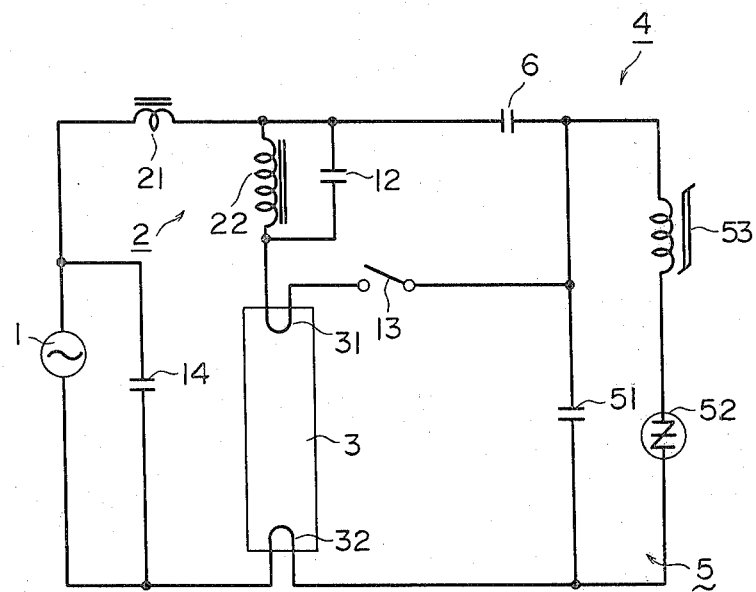

FIG. 18 shows a schematic diagram of another embodiment of the FIG. 14 block diagram for igniting a hot cathode type discharge lamp 3 such as a fluorescent lamp. FIG. 18 differs from FIG. 17 in the following respects. The discharge lamp 3 comprises the filaments 31 and 32. The intermittent oscillation circuit 4 is connected to the non-power supply end of the filament 32. The capacitor 6 is connected in parallel to the second inductor 22. A switch 13 is interposed between the non-power supply end of the filament 31 and the junction of the intermittently oscillating capacitor 6 and the oscillation circuit 5. A noise preventing capacitor 14 is connected in parallel to the power supply 1.

In operation, the switch 13 is closed for starting the discharge lamp 3, whereby the low frequency current flows through the path of the a.c. power supply 1—the first inductor 21—the second inductor 22—the filament 31—the switch—the oscillating capacitor 51—the filament 22 and back to the a.c. power supply 1, whereby the oscillating capacitor 51 is charged. When the terminal voltage of the oscillating capacitor 51 exceeds the breakover voltage of the thyristor 52, the thyristor 52 becomes conductive, whereby the oscillation circuit 5 starts oscillating. The oscillation output voltage is applied through the switch 13 to the discharge lamp 3. At the same time the filaments 31 and 32 are preheated by the input current flowing into the oscillation circuit 5. Since the intermittently oscillating capacitor 6 has been bypassed by the switch 13 at that time, the oscillation circuit 5 keep oscillating, whereby the oscillation current $i_O$ of the oscillation circuit 5 becomes continuous and hence differs from that shown in FIG. 2A. Therefore, the preheating current flowing into the filaments 31 and 32 is sufficiently large.

When the filaments 31 and 32 are thus sufficiently preheated, the discharge lamp 3 is triggered by the oscillation output voltage from the oscillation circuit 5 and is lighted. Thereafter the siwtch 13 is opened. In such a state the intermittent oscillating capacitor 6 becomes effective and is gradually charged as the oscillation circuit 5 oscillates. Therefore, the terminal voltage of the intermittent oscillating capacitor 6 offsets the power supply voltage, whereby the intermittent oscillation circuit 4 oscillates intermittently during a predetermined phase or portion of each half cycle of the alternating current of the power supply voltage in the same manner as described above. As a result, the discharge lamp 3 is reignited by the intermittent oscillating output from the intermittent oscillation circuit 4 at said predetermined phase of each half cycle of the power supply voltage, whereby the discharge or lit conduction of the lamp is sustained.

If the second inductor 22 had not been provided, then the high frequency current would not have flowed into the discharge lamp 3 during the intermittent oscillating operation of the intermittent oscillation circuit 4. However, since the embodiment shown employs the second inductor 22, the low frequency lamp current flows through the second inductor 22 into the discharge lamp 3 during the intermittent oscillating portion of the intermittent oscillation circuit 4, which serves to fill the current lacking portion, thereby to eliminate the current lacking portion of the low frequency lamp current. Hence, the overall efficiency of the lighting device of the discharge lamp 3 is enhanced. Furthermore, since the intermittently oscillating capacitor 6 may be short-circuited by means of the switch 13 at the time of starting, the intermittently oscillating capacitor 6 may have a considerably reduced capacitance.

Figure 19:
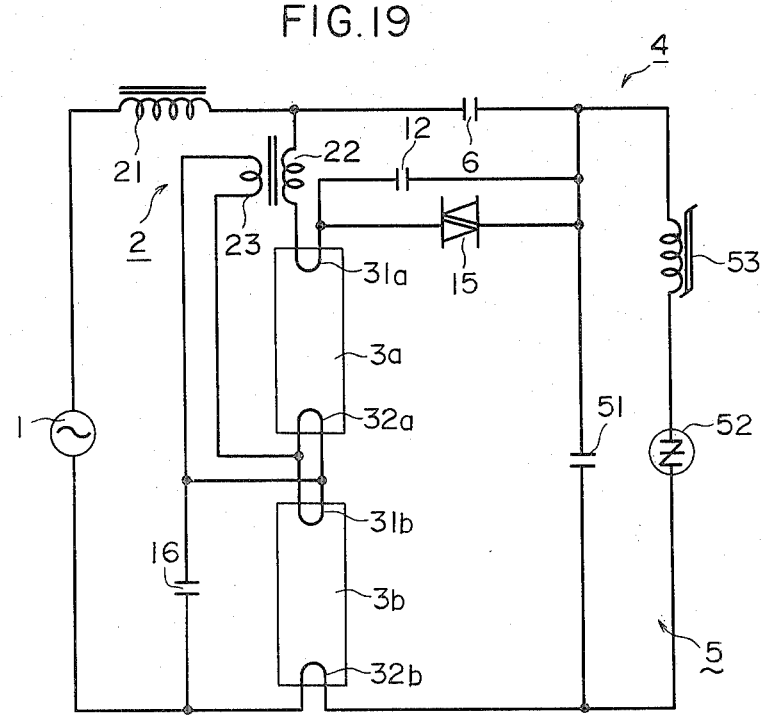

FIG. 19 is a schematic diagram of a discharge lamp lighting apparatus of another specific embodiment of FIG. 14, FIG. 19 differs from FIG. 18 because FIG. 19 is arranged for lighting two discharge lamps 3a and 3b connected in series. Another difference is that a bidirectional thyristor 15 forms, for example, a current controlled, non-linear resistive element which places the switch 13. The second inductor 22 comprises a secondary winding 23 connected to the filaments 32a and 31b. A sequential starting capacitor 16 is connected in parallel with the discharge lamp 3b. A series connection of the capacitor 12 and the intermittently oscillating capacitor 6 is connected in parallel to primary winding of the second inductor 22.

At the beginning of the operation of the circuit of FIG. 19 the filament 32b is preheated by the input current flowing into the intermittent oscillation circuit 4 when the latter oscillates while the intermittently oscillating capacitor 6 is gradually charged. When the terminal voltage thereof exceeds the breakover voltage of the thyristor 15, the latter becomes conductive. Therefore, the discharge current of the intermittent oscillating capacitor 6 flows through the path of the intermittently oscillating capacitor 6—the second inductor 22—the filament 31a—the thyristor 15—and back to the intermittently oscillating capacitor whereby the filament 31a is directly preheated. At that time a voltage is induced in the secondary winding 23 of the second inductor 22. The induced voltage preheats the filaments 32a and 31b. As the oscillating voltage of the oscillation circuit 5 is supplied to the discharge lamp 3a through the sequential starting capacitor 16, the discharge lamp 3a is started or lit and then the discharge lamp 3b is started or lit. After the start of both discharge lamps 3a and 3b, the thyristor 15 remains non-conductive. More specifically, the ON/OFF operation of the manual switch 13 shown in FIG. 18 is automatically performed by the thyristor 15. Apart from the just described differences, the operation of FIG. 19 is substantially the same as that of FIG. 18.

Although the invention has been described with reference to specific example embodiments, it will be appreciated, that it is intended to cover all modifications and equivalents within the scope of the appended claims.

What is claimed is:

1. A discharge lamp lighting circuit system, comprising: low frequency alternating current power supply means for supplying a low frequency alternating current, discharge lamp means coupled to said low frequency alternating current power supply means, linear inductor means coupled between said low frequency alternating current power supply and said discharge lamp means, intermittent high frequency, high voltage generating means operatively connected for being energized by said lower frequency alternating current power supply means, for generating intermittently a high frequency energy in each half cycle of said low frequency alternating current, said high frequency energy being supplied to said discharge lamp means for reigniting said discharge lamp means in each half cycle of said low frequency alternating current power supply means, and supplied energy controlling means (7) operatively associated with said discharge lamp means and with said intermittent high frequency, high voltage generating means for controlling the energy supplied to said discharge lamp means, said supplied energy controlling means (7) comprising impedance circuit means having an impedance characteristic with a low impedance for high frequency and a high impedance for low frequency for supplying simultaneously to said lamp means in an optimally coordinated manner a low frequency current from said low frequency alternating current power supply and an intermittent high frequency current from said high voltage generating means during each half cycle of said low frequency alternating current for reigniting said discharge lamp means in each half cycle of said low frequency alternating current.

2. The discharge lamp lighting circuit system of claim 1, wherein said supplied energy controlling means comprises means for supplying a low frequency current from said low frequency alternating current power supply to said discharge lamp means during the operation of said intermittent high frequency, high voltage generating means.

3. The discharge lamp lighting circuit system of claim 2, wherein said means for supplying a low frequency current during the operation of said intermittent high frequency, high voltage generating means, comprises means for superimposing said high frequency current from said intermittent high frequency, high voltage generating means on said low frequency current in a plus polarity manner.

4. The discharge lamp lighting circuit system of claim 2, wherein said means for supplying a low frequency current during the operation of said intermittent high frequency, high voltage generating means, comprises means for superimposing said high frequency current from said intermittent high frequency high voltage generating means on said low frequency current in a minus polarity manner.

5. The discharge lamp lighting circuit system of claim 1, wherein said supplied energy controlling means comprises impedance means for supplying said high frequency current generated by said intermittent high frequency, high voltage generating means to said discharge lamp means and for providing a given impedance to said low frequency alternating current power supply during the operation of said intermittent high frequency, high voltage generating means.

6. The discharge lamp lighting circuit system of claim 5, wherein said impedance means comprises low frequency current sustaining means operatively coupled to said intermittent high frequency, high voltage generating means for sustaining a low frequency current.

7. The discharge lamp lighting circuit system of claim 5, wherein said impedance means comprises low frequency current sustaining means operatively coupled to the input of said intermittent high frequency, high voltage generating means for sustaining a low frequency current, and high frequency bypassing means operatively connected substantially in parallel with said low frequency current sustaining means for bypassing a high frequency current.

8. The discharge lamp lighting circuit system of claim 1, wherein said supplied energy controlling means comprises matching means interposed between said discharge lamp means and said intermittent high frequency, high voltage generating means, said matching means being adapted to provide such an impedance value that the internal impedance of said intermittent high frequency, high voltage generating means and the external impedance including said impedance of said matching means and the impedance of said discharge lamp means may be matched.

9. The discharge lamp lighting circuit system of claim 8, wherein said matching means is adapted to provide an impedance which supplies the maximum electric power from said intermittent high frequency, high voltage generating means to said discharge lamp means.

10. The discharge lamp lighting circuit system of claim 8, wherein said matching means comprises a high frequency blocking inductor.

11. The discharge lamp lighting circuit system of claim 8, wherein said matching means comprises a T-type circuit including at least one high frequency blocking inductor.

12. The discharge lamp lighting circuit system of claim 8, wherein said matching means comprises an L-type circuit including at least one high frequency blocking inductor.

13. The discharge lamp lighting circuit system of claim 8, wherein said matching means comprises a high frequency transformer including a primary winding and a secondary winding.

14. The discharge lamp lighting circuit system of claim 1, wherein said supplied energy controlling means is constructed and arranged so that said intermittent high frequency, high voltage generating means is coupled in parallel to a series connection of at least a portion of said linear inductor means operating as current limiting means and said discharge lamp means, whereby the low frequency current is allowed to flow in the discharge lamp means during the operation of said intermittent high frequency, high voltage generating means.

15. The discharge lamp lighting circuit system of claim 1, further comprising current limiting means including a series connection of at least a first inductor and a second inductor, and wherein said intermittent high frequency, high voltage generating means is connected in parallel to a series connection of one of said first or second inductor and said discharge lamp means.

16. The discharge lamp lighting circuit system of claim 15, wherein said first and second inductors comprise separate magnetic flux circuit means.

17. The discharge lamp lighting circuit system of claim 15, wherein said first and second inductors comprise common magnetic flux circuit means.

18. The discharge lamp lighting circuit system of claim 15, wherein at least one of said first and second inductors is connected to bypass said high frequency current from said intermittent high frequency, high voltage generating means to said discharge lamp means.

19. The discharge lamp lighting circuit system of claim 1 or 2 or 5 or 8 or 14 or 15, wherein said intermittent high frequency, high voltage generating means comprises an oscillation circuit including a series connection of a non-linear inductor and a current controlled type non-linear resistive element, an oscillating capacitor connected in parallel to said series connection, and an intermittent oscillating capacitor connected in series with at least said current controlled type non-linear resistive element.

20. The discharge lamp lighting circuit system of claim 1 or 2 or 5 or 8 or 14 or 15, wherein said discharge lamp means comprise a hot cathode type discharge lamp including a filament, and which further comprises filament preheating means for preheating said filament with current of said intermittent high frequency, high voltage generating means.

* * * * *